(12) United States Patent
Kariya

(10) Patent No.: US 8,334,466 B2
(45) Date of Patent: *Dec. 18, 2012

(54) MULTILAYER PRINTED WIRING BOARD

(75) Inventor: Takashi Kariya, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 169 days.

This patent is subject to a terminal disclaimer.

(21) Appl. No.: 12/842,431

(22) Filed: Jul. 23, 2010

(65) Prior Publication Data

US 2010/0288544 A1    Nov. 18, 2010

Related U.S. Application Data

(63) Continuation of application No. 12/163,286, filed on Jun. 27, 2008, now Pat. No. 7,781,681, which is a continuation of application No. PCT/JP2006/326376, filed on Dec. 27, 2006.

(30) Foreign Application Priority Data

Dec. 27, 2005    (JP) .................................. 2005-373733

(51) Int. Cl.
*H05K 1/16*    (2006.01)

(52) U.S. Cl. ........ 174/260; 174/255; 174/256; 174/262; 361/301.1; 361/311; 361/763; 361/767; 361/792; 257/700; 257/707; 257/778; 438/618

(58) Field of Classification Search .................. 174/260, 174/255, 256, 262; 361/792, 301.1, 311, 361/763, 767; 257/700, 707, 778; 438/618

See application file for complete search history.

(56) References Cited

U.S. PATENT DOCUMENTS

| 5,543,661 | A | 8/1996 | Sumida |
| 6,333,857 | B1 * | 12/2001 | Kanbe et al. .................. 361/792 |
| 6,534,852 | B1 | 3/2003 | Lin et al. |
| 6,538,213 | B1 | 3/2003 | Carden et al. |
| 6,566,761 | B1 | 5/2003 | Sharma et al. |
| 6,613,986 | B1 | 9/2003 | Hirose et al. |
| 7,250,681 | B2 | 7/2007 | Matsunaga |
| 7,262,975 | B2 | 8/2007 | Kariya et al. |
| 7,271,495 | B2 | 9/2007 | Prengel et al. |

(Continued)

FOREIGN PATENT DOCUMENTS

JP    11-289025 A    10/1999

(Continued)

*Primary Examiner* — Xiaoliang Chen
(74) *Attorney, Agent, or Firm* — Oblon, Spivak, McClelland, Maier & Neustadt, L.L.P.

(57) ABSTRACT

A multilayer printed wiring board including a core substrate, a built-up wiring layer having a first surface in contact with the substrate and a second surface, the second surface including a mounting area for mounting a semiconductor device, the built-up layer including circuits and insulating layers, first through-hole conductors formed in a first portion of the substrate which corresponds to the mounting area, second through-hole conductors formed in a second portion of the substrate which corresponds to an area of the second surface other than the mounting area, third through-hole conductors formed in a processor core area of the first portion of the substrate which corresponds to a processor core section of the device, and pads provided on the second surface. The first conductors have a pitch smaller than a pitch of the second conductors, and the third conductors have a pitch smaller than the pitch of the first conductors.

13 Claims, 5 Drawing Sheets

U.S. PATENT DOCUMENTS

| | | | |
|---|---|---|---|
| 7,462,784 | B2 | 12/2008 | Kariya et al. |
| 7,489,521 | B2 | 2/2009 | Kariya et al. |
| 7,495,332 | B2 | 2/2009 | Kariya et al. |
| 7,518,225 | B2* | 4/2009 | Emma et al. .................. 257/686 |
| 7,518,691 | B2 | 4/2009 | Kobayashi et al. |
| 7,754,978 | B2 | 7/2010 | Kariya et al. |
| 7,781,681 | B2* | 8/2010 | Kariya .......................... 174/260 |
| 2004/0264103 | A1 | 12/2004 | Otsuka et al. |
| 2006/0006547 | A1 | 1/2006 | Matsunaga |
| 2006/0076691 | A1 | 4/2006 | Prengel et al. |
| 2006/0180341 | A1 | 8/2006 | Kariya et al. |
| 2007/0013049 | A1 | 1/2007 | Asai et al. |
| 2007/0029106 | A1 | 2/2007 | Kato |
| 2007/0064375 | A1* | 3/2007 | Urashima et al. ............ 361/311 |
| 2007/0076392 | A1* | 4/2007 | Urashima et al. ............ 361/763 |
| 2007/0085203 | A1 | 4/2007 | Kariya et al. |
| 2007/0256858 | A1 | 11/2007 | Kariya et al. |
| 2007/0295532 | A1 | 12/2007 | Kariya et al. |
| 2009/0000812 | A1* | 1/2009 | Kariya .......................... 174/260 |
| 2009/0255716 | A1 | 10/2009 | Kariya et al. |
| 2009/0260857 | A1 | 10/2009 | Kariya et al. |
| 2009/0290316 | A1* | 11/2009 | Kariya .......................... 361/767 |
| 2010/0117779 | A1 | 5/2010 | Mano et al. |
| 2010/0230148 | A1 | 9/2010 | Kariya et al. |
| 2010/0243299 | A1 | 9/2010 | Kariya et al. |

FOREIGN PATENT DOCUMENTS

| | | |
|---|---|---|
| JP | 2002-374066 | 12/2002 |
| JP | 2005-33195 A | 2/2005 |
| JP | 2005-311182 A | 11/2005 |
| JP | 2005-333078 | 12/2005 |
| WO | WO 2004/091268 A1 | 10/2004 |

* cited by examiner

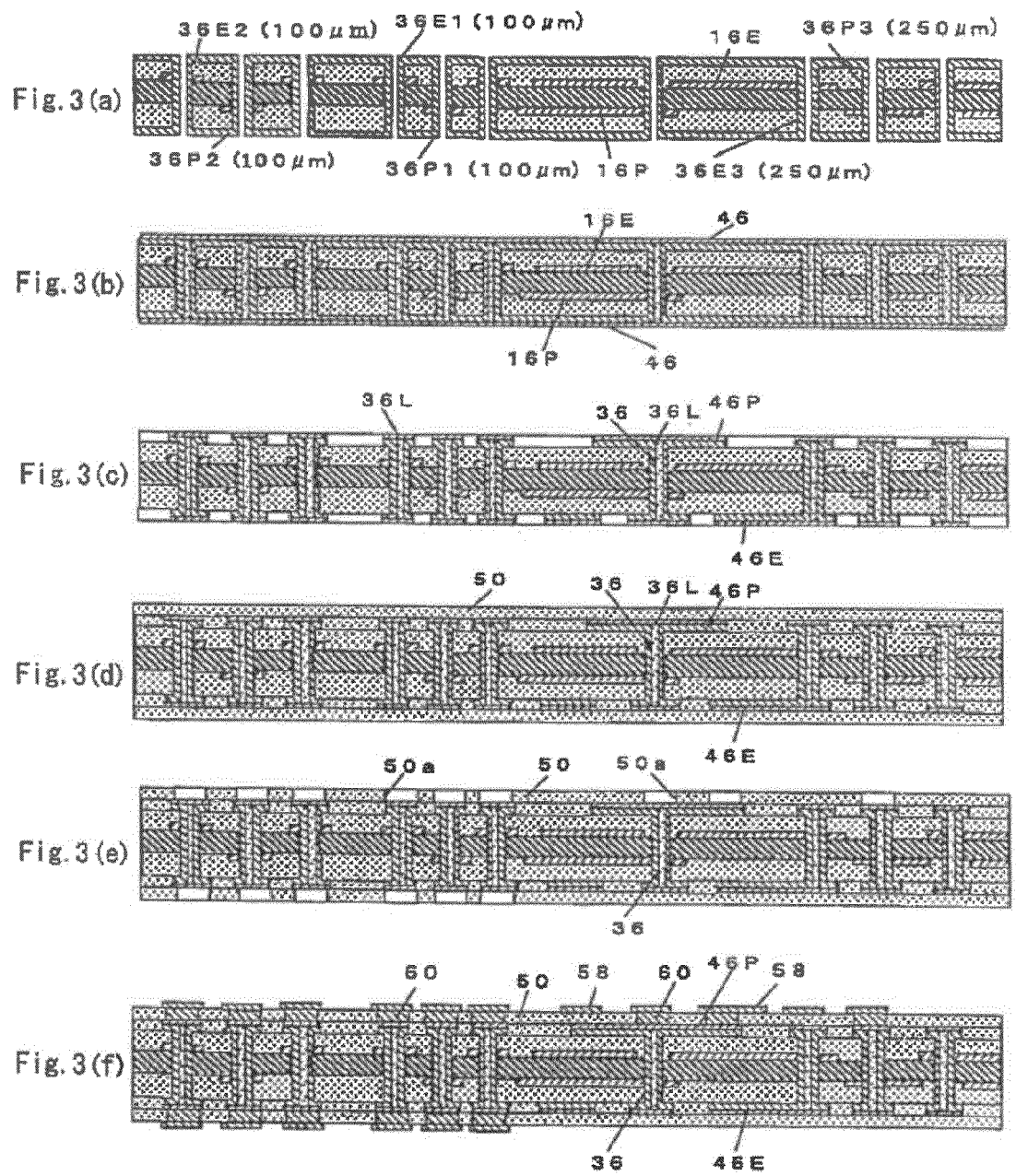

US 8,334,466 B2

MULTILAYER PRINTED WIRING BOARD

CROSS-REFERENCE TO RELATED APPLICATIONS

This application is a continuation of and claims benefit of priority from U.S. application Ser. No. 12/163,286, filed Jun. 27, 2008, which is a continuation application of PCT/JP2006/326376, filed Dec. 27, 2006, which claims priority to JP 2005-373733 filed Dec. 27, 2005. The entire contents of each of these applications are incorporated herein by reference.

TECHNICAL FIELD

The present invention relates to a multilayer printed wiring board on which a semiconductor device such as an IC chip is mounted, and especially relates to a substrate, on which a semiconductor device is mounted, that may suppress errors in the high-frequency region.

DESCRIPTION OF RELATED ART

As a conventional semiconductor device mounting substrate, Japanese Patent Publication No. 2002-374066 discloses a build-up substrate made by alternately layering insulating layers and conductor circuits on a core substrate on which through-hole conductors are formed. The entire contents of this publication are incorporated herein by reference.

SUMMARY OF THE INVENTION

On aspect of the invention includes a multilayer printed wiring board having a core substrate and a built-up wiring layer formed by alternately layering conductor circuits and insulating resin layers. The built-up wiring layer includes a first surface provided in contact with the core substrate, and a second surface opposing the first surface and including a mounting area on which at least one semiconductor device is to be mounted. A first plurality of through-hole conductors is formed in a first portion of the core substrate which corresponds to the mounting area of the second surface, and a second plurality of through-hole conductors formed in a second portion of the core substrate which corresponds to another area of the second surface other than the mounting area. A pitch between the first plurality of through-hole conductors is smaller than a pitch between the second plurality of through-hole conductors.

Another aspect of the invention includes a method of forming a multilayer printed wiring board, including providing a core substrate and providing a built-up wiring layer on the core substrate. The built-up wiring layer is formed by alternately layering conductor circuits and insulating resin layers, and the built-up wiring layer has a first surface provided in contact with the core substrate and a second surface opposing the first surface and including a mounting area on which at least one semiconductor device is to be mounted. A first plurality of through-hole conductors is provided in a first portion of the core substrate which corresponds to the mounting area of the second surface, and a second plurality of through-hole conductors is provided in a second portion of the core substrate which corresponds to another area of the second surface other than the mounting area. A pitch between the first plurality of through-hole conductors is made smaller than a pitch between the second plurality of through-hole conductors.

Still another aspect of the invention includes a multilayer printed wiring board having a core substrate and a built-up wiring layer formed by alternately layering conductor circuits and insulating resin layers. The built-up wiring layer includes a first surface provided in contact with the core substrate and a second surface opposing the first surface and including a mounting area on which at least one semiconductor device is to be mounted. Multiple pads are provided on the second surface, and multiple through-hole conductors formed in the core substrate. The multiple pads and the multiple through-hole conductors are arranged as represented by the following equation:

$$Bc/Tc < Bp - Bc/Tp - Tc, \text{ where:}$$

Bc represents the number of pads arranged in an area directly below a processor core section of the semiconductor device to be mounted, Tc represents the number of through-hole conductors arranged in an area directly below the processor core section of the semiconductor device to be mounted, Bp represents the total number of pads of the printed wiring board, and Tp represents the total number of through-hole conductors of the printed wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein:

FIGS. 3 (a) to (f) are drawings showing part of the process of producing the multilayer printed wiring board according to an embodiment of the invention.

DETAILED DESCRIPTION OF EMBODIMENTS

Figure 1:
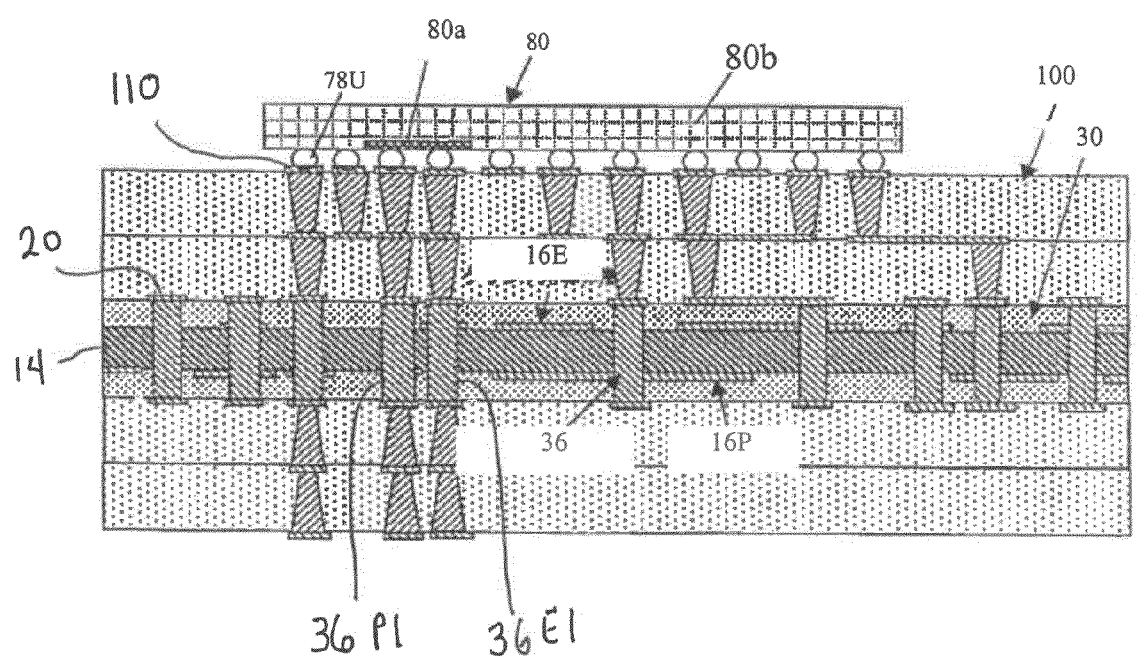
FIG. 1 is a schematic view for describing the arrangement of through-hole conductors on the multilayer printed wiring board according an embodiment of the invention.
Figure 2A:
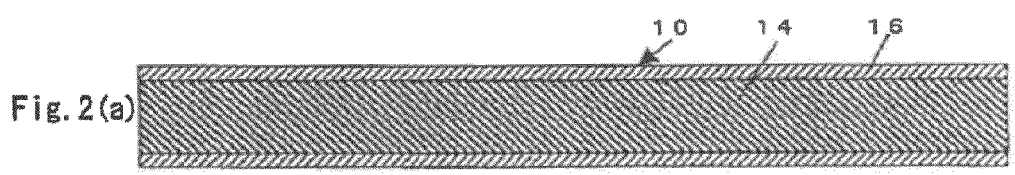
FIGS. 2 (a) to (e) are drawings showing part of the process of producing the multilayer printed wiring board according to an embodiment of the invention.
Figure 2B:
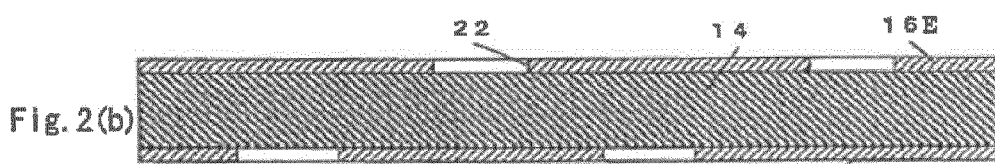
Figure 2C:
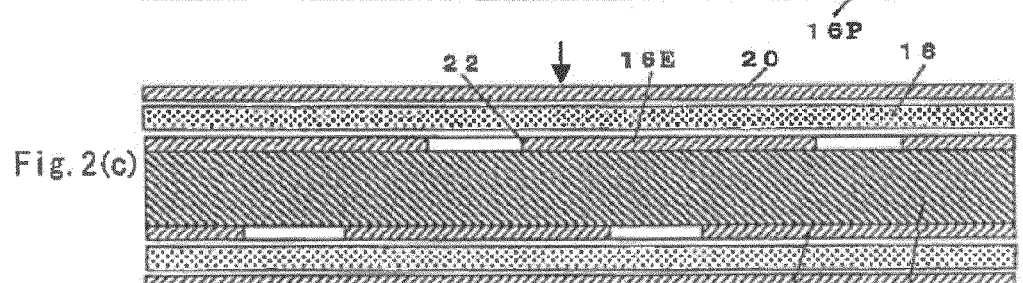
Figure 2D:
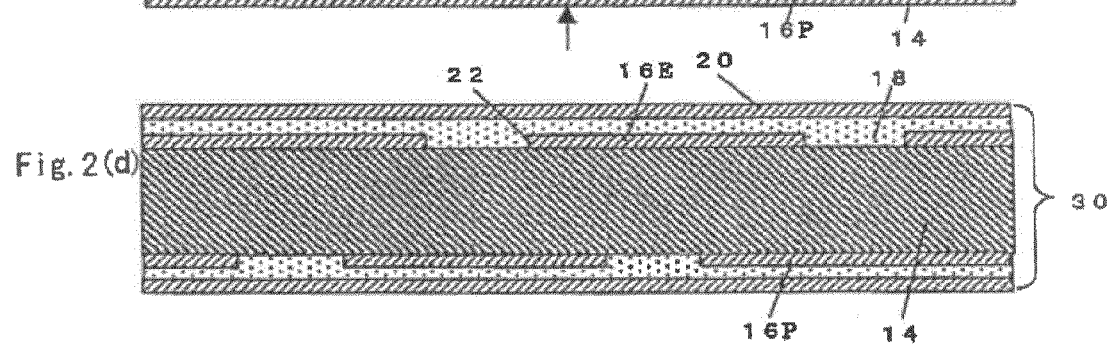
Figure 2E:
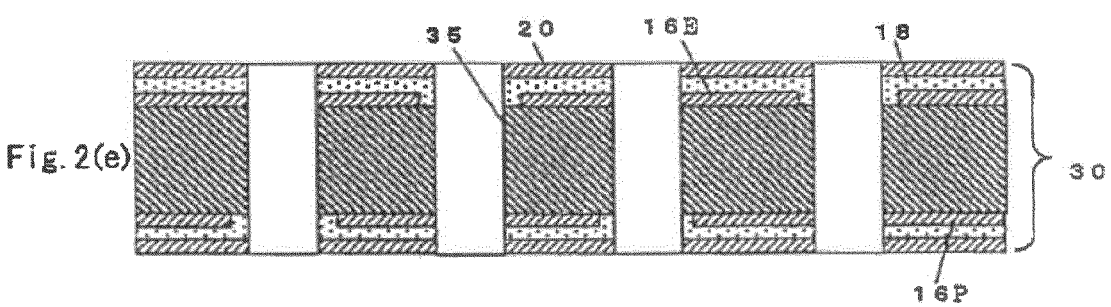

The multilayer printed wiring board, on which a semiconductor device is mounted as described above according to the prior art, has problems in which, when a relatively large IC chip having a plurality of electrodes and which drives with a high speed equivalent to 3 GHz or higher is mounted on a substrate, the mounted IC chip is prone to errors. Therefore, one object of the present invention is to provide a multilayer printed wiring board on which to mount semiconductor devices in which IC chip errors rarely occur.

One embodiment of the present invention provides a multilayer printed wiring board wherein, on a core substrate having through-hole conductors, a build-up wiring layer is formed by alternately layering conductor circuits and insulating resin layers on the front layer of the build-up wiring layer, a mounting section on which to mount semiconductor devices such as an integrated circuit chip (hereinafter referred to as an "IC chip") is formed. The pitch between through-hole conductors arranged directly below the area on which said IC chip is mounted is smaller than the pitch between through-hole conductors formed in other areas of the printed wiring board.

The IC chip to be mounted according to the present invention is primarily composed of a processor core section and a memory section. In one embodiment of the invention the pitch between through-hole conductors arranged directly below the processor core section may be smaller (i.e. narrow pitch) than the pitch between through-hole conductors formed in areas other than the processor core section.

As used herein, the term "through-hole conductor" is defined as a conductor layer that electrically connects conductor layers formed on the front and back surfaces of a core substrate or a printed wiring board; this includes not only a type forming a conductor layer on the inner wall of a through-bore passing through all of the layers of a core substrate or a printed wiring board, but also a type made by plating to fill in the through-bore.

In one embodiment, a first plurality of through-hole conductors is formed in a first portion of the core substrate corresponding to a mounting area of the built up wiring layer for mounting at least one semiconductor device. A second plurality of through-hole conductors is formed in a second portion of the core substrate which corresponds to another area of the built-up wiring layer other than the mounting area. As used herein, a through hole "which corresponds to" an area of the built-up wiring layer (such as the mounting area) has at least a portion of its structure (but not necessarily all) provided within the area. That is, an entire through hole structure does not have to be directly below an area for the through hole to correspond to that area. Further, the term "area" may be a single continuous area (such as for one IC chip or one processor region of an IC chip), or discrete areas for separate devices and/or processors.

In one embodiment of the present invention, Bc represents the number of pads for mounting an IC chip that are directly below the processor core section of an IC chip, Tc represents the number of through-hole conductors arranged directly below the processor core section of the IC chip, Bp represents the total number of all pads of the printed wiring board connected to electrodes on the IC chip, and Tp represents the total number of all through-hole conductors. With this designation, the pads for mounting IC chips and the through-hole conductors may be arranged as represented in the following equation:

$$Bc/Tc < Bp-Bc/Tp-Tc$$

In addition, when Pc represents the pitch between through-hole conductors arranged directly below the processor core section of an IC chip, Pm represents the pitch between through-hole conductors arranged directly below the area on which an IC chip is mounted but not directly below the processor core section, and Ps represents the pitch between through-hole conductors mounted in areas other than where IC chips are mounted, the disposition density of a through-hole conductor may be represented in the following equation:

$$Pc < Pm \leq Ps$$

In other words, through-hole conductors may be formed so that the disposition density of through-hole conductor is relatively high in the area directly below the processor core section and decreases toward areas other than directly below the processor core section of the IC chip.

The pitch Pc between through-hole conductors arranged directly below the processor core section may be 125-250 μm. The pitch Pm between through-hole conductors arranged directly below areas other than the processor core section but directly below the IC chip may be 150-600 μm. The pitch Ps between through-hole conductors arranged in areas other than directly below the IC chip may be 200-600 μm.

In an embodiment of the present invention, the through-hole conductors and pads may be arranged so that the pitch Pc between through-hole conductors arranged directly below the processor core section of the IC chip is matched to the pitch between pads arranged directly below the processor core section. Positioning of the through-hole conductors to match the positioning of the pads is preferred, but not necessary.

In embodiments of the present invention, the core substrate is a multilayer core substrate made by alternately layering conductor circuits and insulating resin layers on the core material. When T represents the thickness of the conductor circuit formed inside said multilayer core substrate and t represents the thickness of the conductor circuit formed on the front surface of the multilayer core substrate, T may be equal to or greater than 1.5 t.

According to a multilayer printed wiring board of embodiments of the present invention, making the pitch between through-hole conductors arranged directly below the IC chip smaller than the pitch between through-hole conductors arranged in areas other than directly below the IC chip—i.e., making the pitch narrow—the mutual inductance may be decreased because the pitch between the power supply through-hole conductor and the base through-hole conductor becomes narrow. Consequently, the power supply delay to the processor core section of an IC chip can be suppressed, making IC chip errors rare.

In addition, because the processor core substantially affects IC chip errors, making the pitch between through-hole conductors arranged directly below the processor core section smaller than the pitch between through-hole conductors formed on areas other than the processor core section is effective in reducing or preventing IC chip errors.

Below is a description of specific embodiments of the multilayer printed wiring board according to embodiments of the present invention with reference to attached drawings.

In one embodiment of a multilayer printed wiring board on which to mount a semiconductor device according to the present invention, as shown in FIG. 1, multiple through-hole conductors 36 are formed passing through the core substrate 30. On the core substrate 30, a build-up wiring layer 100 is formed by alternately layering conductor circuits and insulating resin layers as will be described further below. On the front layer of the build-up wiring layer 100, there is a mounting section including pads 110 on which to mount an IC chip 80. The pitch between through-hole conductors 36P1 and 36E1 arranged directly below the area on which the IC chip is mounted is made smaller than a pitch between through-hole conductors 36 in areas other than where the IC chip is mounted (i.e., the pitch between through-hole conductors located in the area around the outside of the IC chip mounted area).

As described above, by making the pitch between through-hole conductors arranged directly below the IC chip mounting area smaller than the pitch between through-hole conductors formed in other areas, the pitch between the power supply through-hole conductor (to be connected to the power supply electrode of the IC chip) and the base through-hole conductor (to be connected to the base electrode of the IC) becomes narrower, resulting in smaller mutual inductance. Consequently, the delay of power supply to the processor core section of IC chip is suppressed, resulting in suppression of IC chip errors. The power supply through-hole conductor 36 P1 and the base through-hole conductor 36 E1 are preferably disposed in a lattice or staggered pattern, and the power supply through-hole conductor 36 P1 and the base through-hole conductor 36 E1 are preferably arranged adjacently.

In an embodiment of the present invention, the IC chip 80 mounted on the substrate is primarily composed of a processor core section 80a and a memory section, and the pitch between through-hole conductors arranged directly below the processor core section 80a is preferably smaller (narrow pitch) than the pitch between through-hole conductors formed in areas other than the processor core section 80b (such as the memory section).

Because the processor core substantially affects IC chip errors, if the pitch between through-hole conductors mounted directly below the processor core section is relatively narrow, power is supplied to the processor core with minimum delay, enabling the suppression of errors. In addition, the size of the printed wiring board on which an IC chip is mounted is typically about 1.2 to 7 times larger than the size of the IC chip 80. On such a printed wiring board, if the pitch between through-holes in areas other than the processor core section is made larger than the pitch between through-holes directly below the processor core, the strength of the printed wiring board may be improved because the through holes may be arranged on almost the entire surface of the printed wiring board. Thus, printed wiring board warping as such can become smaller, so that the mounting yield of IC chips and connection reliability of the IC chip to the printed wiring board are improved.

In an embodiment of the present invention, Bc represents the number of pads arranged directly below the processor core section of an IC chip, Tc represents the number of through-hole conductors arranged directly below the processor core section, Bp represents the number of all of the pads connected to electrodes on the IC, and Tp represents the number of all of the through-hole conductors connected to the IC. With this designation, the pads and the through-hole conductors are preferably arranged as represented in the following equation:

$$Bc/Tc < Bp-Bc/Tp-Tc$$

As the relationship between the number of pads and the number of through-holes is determined as Bc/Tc<Bp-Bc/Tp-Tc, the number of through-holes may be decreased compared to the number of pads, while keeping the through-hole pitch directly below the processor core at a narrow pitch. Therefore, the length of the conductor circuit may be reduced as it extends from the base through-hole conductor passing through the power supply conductor layer (the through-hole conductor connected to the base electrode of the IC chip) and the base through-hole conductor in the power supply conductor layer, the area or volume of the power supply conductor layer may be increased. That is, fewer base through holes will need to extend through the power supply conductor layer, and therefore the power supply conductor layer can have a greater area of coverage. Consequently, as the resistance in the power supply conductor layer becomes smaller, it becomes possible to supply power to the IC chip without delay, or with minimum delay. For example, it becomes possible to reduce errors of the IC chip.

In addition, in an embodiment according to the present invention, when Pc represents the pitch between through-hole conductors arranged directly below the processor core section of an IC chip, Pm represents the pitch between through-hole conductors arranged directly below the area on which an IC is mounted but not directly below the processor core section, and Ps represents the pitch between through-hole conductors mounted in areas other than where IC chips are mounted, the distribution density of through-hole conductors may be represented in the following equation:

$$Pc < Pm \leq Ps$$

In other words, through-hole conductors are preferably formed so that the distribution density of through-hole conductors decreases toward areas other than directly below the processor core section of the IC chip, from the area directly below the processor core section.

For example, the pitch Pc between through-hole conductors arranged directly below the processor core section may be 125-250 μm. The pitch Pm between through-hole conductors arranged directly below areas other than the processor core section but directly below the IC chip may be 150-600 μm. In addition, the pitch Ps between through-hole conductors formed in areas other than directly below the IC chip may be 200-600 μm.

Because the pitch directly below the processor core of the IC chip demanding power supply is narrow, the power is supplied to the IC chip smoothly. Moreover, as the pitch is relatively wide in other areas, the strength of the printed wiring board may be improved.

In an embodiment according to the present invention, the through-hole conductors and pads are preferably arranged so that the pitch Pc between through-hole conductors arranged directly below the processor core section constituting the IC chip is matched to the pitch Bc between pads arranged directly below the processor core section as shown in the example of FIG. 1. With this arrangement the power supply delay to the IC chip can be further suppressed, as the wiring length may be shortened.

In addition, in an embodiment of the present invention, the core substrate 30 is formed from a multilayer core substrate made by alternately layering conductor circuits and insulating resin layers on the core material. When T represents the thickness of the conductor circuit (16E, 16P) formed inside said multilayer core substrate and t represents the thickness of conductor circuit 20 formed on the front surface of the multilayer core substrate 30, T is preferably equal to or greater than 1.5 t. With this arrangement, as the conductor circuit (16E, 16P) is thick, the resistance is low, and the power supply becomes smooth when using a conductor circuit formed inside the multilayer core substrate as a conductor layer for power supply or a base conductor layer.

In an embodiment according to the present invention, as an insulating resin base material 14, it is preferable to use one rigid raw material selected from among glass cloth epoxy resin base material, glass cloth bismaleimide-triazine resin base material, glass cloth polyphenylenether resin base material, unwoven aramid cloth-epoxy resin base material, and unwoven aramid cloth—polyimide resin material, and more preferable to use glass cloth epoxy resin base material. The thickness of said insulating resin base material 14 is preferably about 30-800 μm. The reason is because, if the thickness is less than 30 rigidity is insufficient, but if it is thicker than 800 μm, the wiring length becomes longer, resulting in a disadvantage in the power supply.

The conductor circuit (16E, 16P) formed on both surfaces of such an insulating resin base material 14 is, as described later, after plating in through-bores for through-hole conductors, preferably formed by etching the metal foil pasted on both sides of the insulating resin base material and the plated layer formed thereon. The thickness of the conductor circuit (16E, 16P) formed on both sides of said insulating resin base material is about 10-40 μm. The reason is because, if it is less than 10 μm, resistance becomes high when used as a power supply conductor layer or a base conductor layer, but if it exceeds 40 μm, the flatness of the build-up wiring layer to be formed on the substrate is inferior.

For a substrate comprising the insulating resin base material and metal foils, especially a one-side copper clad laminate obtained by layering and heat-pressing prepreg as B stage by impregnating epoxy resin in glass cloth, and copper foils may be used. Such a substrate is superior in positioning accuracy, because there is no misalignment in the wiring pattern or a via hole position during handling after copper foils are etched.

In an embodiment according to the present invention, the through-hole conductor 36 is preferably formed by filling metal plating in through-bores after forming through-bores with drilling or laser processing. Furthermore, to improve absorption efficiency of the irradiated laser beam in laser processing, it is preferable to perform well-known blackening of the metal foil on the insulating resin base material in advance.

To form through-bores for through-hole conductors by using a laser on the insulating resin base material, there are two methods: the direct laser method for perforating both the metal foil and the insulating resin base material at the same time with laser irradiation, and the conformal method for perforating the insulating resin base material with laser irradiation after the metal foil portion to be a through-bore on the metal foil is removed by etching. According to the present invention either of these, or other known methods, may be used. The laser processing above is preferably performed with a pulse oscillating type of carbon dioxide gas laser processing device and the processing condition may be within the range of 3-15 μs pulse duration and 2-30 shots.

Moreover, the desmear treatment is performed to remove residue resin left on the side of through-bores that are formed by laser irradiation. This desmear treatment is performed by wet treatment such as chemical reaction of acids of or oxidants (e.g., chrome acid, permanganic acid) by dry treatment such as oxygen plasma discharge treatment, corona discharge treatment, ultra violet laser treatment or excimer laser treatment. Which method is chosen from those desmear treatment methods depends on the type or thickness of the insulating base material, the diameter of opening of through-bores for through-hole conductors, or laser irradiation conditions, considering the smear amount expected to be left.

In an embodiment of the present invention, to form a through-hole conductor by plating in the through-bore, firstly, after forming an electroless plated coat on inner wall of the through-bore with normal electroless plating treatment, normal electrolytic plating may be performed to form a plated metal layer on inner wall surface of the through-bore or to plating inside the through-bore completely. As electroless plating or electrolytic plating described above, metal plating for example copper, tin, silver, various types of solder, metal plating such as copper/tin or copper/silver is preferred, especially, electroless copper plating or electrolytic copper plating is most preferred.

When a through-hole conductor is formed by forming a plated metal layer on an inner wall surface of the through-bore as noted above, resin composition as such is then filled in the through-bore and dried. As required, the surface of the base material covered with the resin composition is polished and flattened so that the surface of the conductor circuit and the land surface of the through-hole conductor is exposed. Then, thermosetting treatment is performed to harden the filling resin composition to obtain a resin filler layer.

In an embodiment according to the present invention, the conductor circuit formed on both sides of the insulating resin base material as a core substrate is preferably formed by etching the conductor layer at the same time when the through-hole conductor is formed. In this conductor circuit formation process, firstly, photosensitive dry film is pasted on the surface of the conductor layer. The film is then exposed and developed according to a predefined circuit pattern to form etching resists, and by etching the conductor layer at parts where etching resists are not formed to create a conductor circuit pattern containing electrode pads. In the treatment process described above, as an etching solution, at least one kind of aqueous solution may be used selected from aqueous solution of sulphate hydrogen monoxide, persulfate, copper chloride, or ferric chloride. In addition, as a pre-treatment for forming a conductor circuit by etching said conductor layer, to make fine pattern formation easier, the thickness may be reduced to 1-10 μm, more preferably to about 2-8 μm by etching the entire surface of the conductor layer in advance.

It is preferred that by using such a printed wiring board as a core substrate, on the core substrate, a multilayer printed wiring board is formed, which is made by forming a build-up wiring layer 100 which is made by layering a conductor layer and a resin insulating layer alternately in a normal manner. A part of the most external conductor layer of the multilayer printed wiring board is used to form pads 110 for connecting bumps at a predefined pitch, and solder bumps 78U are formed on those pads.

Below describes in detail about the multilayer printed wiring board (and method of forming) according to embodiments of the present invention with reference to example embodiments. One embodiment of the method includes providing a core substrate, a built-up wiring layer, a first plurality of through-hole conductors and a second plurality of through-hole conductors. As used herein, the term "providing" means forming or obtaining by other means.

Embodiment 1

A. Preparation of Resin Composition for Filling Through-Bore

Bisphenol F type epoxy monomer (YUKA Shell; molecular mass: 310 YL983U) 100 parts by weight, $SiO_2$, coated with silane coupling agent on surface, Average particle diameter is 1.6 μm and the maximum particle diameter is equal to or less than 15 μm Circular particle (Adtec, CRS1101-CE) 170 parts by weight and leveling agent (Sannopco, Pelenole S4) 1.5 parts by weight are sampled in a container, which is stirred and mixed to prepare a resin filler with viscosity of 44-49 Pa·s at 23±1° C. Furthermore, as a hardening agent, imidazole hardening agent (Shikoku Chemicals, 2E4MZ-CN) 6.5 parts by weight is used. As resin for filling through-bores to form through-hole conductors, other epoxy resin (e.g., bisphenol A type or novolac type), or thermosetting resin such as polyimide resin or phenol resin may be used.

B. Producing Multilayer Printed Wiring Board

Creating Multilayer Core Substrate

1) Referring to FIG. 2 (a), as a starting material, a double-sided copper clad laminate 10 is made by laminating 10-250 μm of copper foil 16 on each side of an insulating base material 14 consisting of 0.6-mm-thick glass epoxy resin or BT (bismaleimide triazine) resin. In Embodiment 1, 30-μm-thick copper foils are used.

2) Then, with the subtractive method, the copper foil 16 on the front surface of the substrate 10 is etched to form an under layer conductor circuit 16E having no dummy land in the blank 22, and the copper foil 16 on the back surface of the substrate 10 is etched to form the under layer conductor circuit 16P having no dummy land in the blank 22 as shown in FIG. 2 (b). Note that the blank (opening) 22, is formed corresponding to the position where a through-hole conductor is formed, as will be discussed below.

Figure 5:
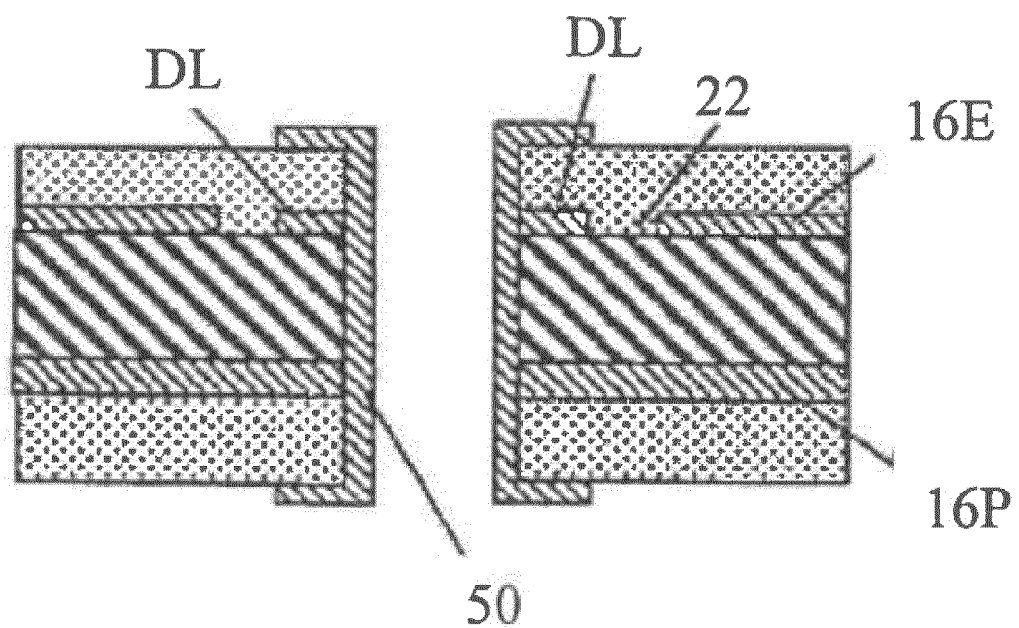
FIG. 5 is a drawing for describing the blank and dummy land when forming a through-hole conductor.

The dummy land is normally formed with a large diameter (of about 150-250 μm) compared to the diameter of the through-hole conductor. The dummy land DL is, as shown in FIG. 5, the conductor circuit around the through-hole formed in the blank 22, extending from the through-hole conductor formed in the inner layer of the multilayer core substrate. By making a conductor circuit without dummy land DL, compared to the normal structure with dummy land, the gap between the power supply through-hole conductor 50 and the base conductor layer 16E, and the gap between the base through-hole conductor (not shown) and the power supply conductor layer 16P may be narrowed. When no dummy land DL is formed, the pitch between through hole conductors may be decreased, the mutual inductance may be decreased or the conductor resistance may be lowered. In addition, the volume of the conductor layer comprising the power layer or the base layer may be increased.

3) Then, the substrate is dipped in the blacking bath (oxidizing bath) of aqueous solution containing NaOH (10 g/l), $NaClO_2$ (40 g/l), and $Na_3PO_4$ (6 g/l) for blackening, and is dipped in the reduction bath of solution containing NaOH (10 g/l) and $NaBH_4$ (6 g/l) for reduction treatment to form a rough surface on the front surface of the under layer of the base conductor layer 16E and the under layer of the power supply conductor layer 16P. Furthermore, a signal conductor circuit may be formed on the front layer of the conductor layer.

4) On both sides of the substrate above, the 200-μm-thick prepreg 18 and then the 18 μm thick copper foil 20 are layered in this order and are then heated and pressure-pressed to create the four-layer multilayer core substrate 30 as shown in FIGS. 2 (c) and (d).

5) This multilayer core substrate 30 is drilled to form the through-bore 35 for forming a through-hole conductor as shown in FIG. 2 (e). At this time, a through-bore 35 arranged directly below the processor core section of the IC chip to be mounted is formed by using the 100-μm-diameter drill so that the pitch is 125 μm, similar to the electrode pitch (pad pitch) of the IC chip. In addition, a through-bore 35 arranged directly below other parts of the IC other than the processor core section is formed by using a 100 μm diameter drill so that those pitch is 150-400 μm. In addition, the through-bore 35 arranged in sections other than the IC is formed by using the 250 μm diameter drill so that those pitch is 300-600 μm; and these through bores can be formed across the entire printed wiring board in areas other than directly below the IC chip 80. In addition, the number of through-hole conductors formed in other than directly below the processor core section of the IC chip may be 10-50% of the number of pads located other than directly below the processor core section, however, in this embodiment, it is 30%.

6) Next, as seen in FIG. 3 (a), on the multilayer core substrate 30 on which the through-bore 35 is formed to form a through-hole conductor in step 5) above, electroless copper plating and electrolytic copper plating is performed to form the through-hole conductors 36 whose diameters passing through the multilayer core substrate are 100 μm, 100 μm and 250 μm respectively. Note that those through-hole conductors 36 comprising a signal through-hole conductor are not shown. The power supply through-hole conductor 36P1 (100 μm) and the base through-hole conductor 36E1 (100 μm), the power supply through-hole conductor 36P2 (100 μm) and the base through-hole conductor 36E2 (100 μm), or the power supply through-hole conductor 36P3 (250 μm) and the base through-hole conductor 36E3 (250 μm) are shown. It is preferable to connect the power supply through-hole conductors and the base through-hole conductors to dispose in a lattice pattern or staggered pattern. The power supply through-hole conductors and the base through-hole conductors only directly below the processor core may be adjacent to dispose in a lattice pattern or grating pattern. Note that the through-holes indicated by the symbol 36P1 and 36E1 in FIG. 3(a) are the through-hole conductors arranged directly below the processor core.

7) Then, the multilayer core substrate 30 with the through-hole conductors 36 formed in step 6) above is dipped in the blacking bath (oxidizing bath) of aqueous solution containing NaOH (10 g/l), $NaClO_2$ (40 g/l), $Na_3PO_4$ (6 g/l) for blackening, and dipped in the reduction bath of solution containing NaOH (10 g/l) and $NaBH_4$ (6 g/l) for reduction treatment to form roughened surface (not shown) on the inner wall of the through-hole conductors 36.

8) Then, the resin composition 40 created in process A above is filled in each of the through-hole conductors 36 using a squeegee, and dried for 20 minutes at 100° C. The surface of the substrate 30 is polished for planarization, and heated for one hour at 100° C., and for one hour at 150° C. to form the resin filler layer by hardening the resin composition 40 for filling through-bores. Then, on the surface of substrate (including the surface of resin for filling through-bores) electroless plating and electrolytic plating is performed to form the conductor layers 46 and 46 on the front and back surface of the multilayer core substrate, as seen in FIG. 3 (b).

In this embodiment, the thickness (thickness of copper) of the conductor layer formed on the front and back surface of the multilayer core substrate is 7.5-70 μm. As described above, the thickness (thickness of copper) of the conductor layer 46 formed on the front surface and back surface of the multilayer core substrate 30 is preferably thinner than the thickness (thickness of copper) of the conductor layer 16 formed inside the multilayer core substrate 30. In this embodiment, the conductor layer 46 formed on the external side of the multilayer core substrate 30 is 20 μm and can form finer circuits compared to the conductor layer 16 formed inside the multilayer substrate. Further, the diameter of the through-hole land may be decreased and the gap between conductor circuits, and the gap between the through-hole land and the conductor circuit may be reduced. Therefore, the through-hole land and the conductor circuit formed on the front and back surface of the multilayer core substrate 30 will not prevent the pitch between through-hole conductors from narrowing.

9) Then, as shown in FIG. 3 (c), with a subtractive method, the conductor layer on the front and back surface of the multilayer substrate is patterned to form the power supply conductor layer 46P on the surface and the base conductor layer 46E on the back surface.

10) After the substrate above is washed with water and acid degreased, it is soft-etched and then etching solution is applied on both sides of the substrate with a spray. The surface of the signal conductor circuit (not shown), the surface of the power supply conductor circuit 46P and the base conductor circuit 46E and the conductor layer covering the land surface of each of the through-hole conductors 36 are etched to form roughened surface (not shown) on the surface of the conductor circuit. The etching solution (Made by Mec, MEC Etch Bond) consisted of 10 parts by weight of imidazole copper (II) complex, 7.3 parts by weight of glycol acid and 5 parts by weight of potassium chloride is used as the etching solution.

When the rough layer is formed on the surface of the conductor layer (filled plated layer) 36L covering the land surface of the conductor circuit and the through-hole conductor, the conductor is superior for the bonding to the inner layer resin insulating layer so that cracking may be suppressed starting from the interface of the side of the conductor covering the land of the conductor circuit and the through-hole conductor, and the resin insulating layer. On the other hand, the bonding of the conductor layer covering the land of the through-hole conductor with the electrically connected via hole is improved.

11) Next, as shown in FIG. 3(d), on both sides of the substrate, a resin film 50 for inner layer insulating layer (Ajinomoto: ABF series) is located on the substrate and temporarily press-bonded under the 0.45 MPa pressure, at 80° C. temperature for pressing duration 10 seconds and cut; and then, is pasted by using a vacuum laminator with the following method. That is, the resin film for inner layer resin insulating layer is permanently press-bonded on the substrate under 67 Pa vacuum and 0.47 MPa pressure, at 85° C. temperature, and for 60 seconds of pressure bonding time, and then hardened for 40 minutes at 170° C.

12) Next, as shown in FIG. 3 (e), on the resin film 50 for inner layer insulating layer, using a mask on which 1.2 mm thick through-bores are formed, with carbon dioxide gas laser under 10.4 μm of wave length, 4.0 mm of beam diameter, in the top hat mode, for 8.1 μs of pulse duration, 1.0 mm diameter of the through-bore on the mask, and 1-3 shots, the opening 50a for a via hole is formed with the diameter of 60-100 μm on the inner layer insulating layer resin film, and the inner layer insulating layer resin film is hardened to form the inner layer insulating layer 50. In this embodiment, the opening 50a is formed with the diameter 60 μm or 75 μm.

13) The substrate, on which the opening 50a for a via hole is formed, is dipped in the 80° C. solution containing 60 g/l of permanganic acid for 10 minutes to remove particles existing on the surface the inner layer insulating layer 50 so that roughened surface (not shown) is formed on the surface of the inner layer insulating layer 50 including the inner wall of the opening 50a for a via hole.

14) Then the substrate from the treatment above is dipped in the neutralization solution (made by Shipley) and washed in water. In addition, on the surface of said substrate treated with roughened surface (rough depth 3 μm), by applying palladium catalyst, catalyst cores are attached on the surface of the inner layer insulating layer and the inner wall of the opening for a via hole. I.e., the substrate is dipped in the catalyst solution containing palladium chloride ($PbCl_2$) and stannous chloride ($SnCl_2$) to apply the catalyst by separating out palladium metal.

15) Next, the catalyst applied substrate is dipped in the electroless copper plating solution that is made up as follows to form the 0.3-3.0 μm thick electroless copper plated coat on the entire roughened surface to obtain the substrate in which the electroless copper plated coat is formed on the surface of the inner layer insulating layer 50 including the inner wall of the opening 50a for a via hole.

The electroless copper plating aqueous solution is as follows:
EDTA: 0.200 mol/l
Copper sulphate: 0.032 mol/l
HCHO 0.1 g/l
NaOH 0.100 mol/l
α,α-bipiridyl: 100 mg/l
Polyethyleneglycol (PEG): 0.10 g/l The electroless plating condition is as follows:
Solution temperature: 34° C.
Duration: 45 minutes 16) A commercially available photosensitive dry film is pasted on the electroless copper plated coated substrate and a mask is placed and exposed at 110 $mJ/cm^2$ and developed with 0.8% sodium carbonate aqueous solution to form the 25 μm thick plated resists (not shown).

17) Next, after the substrate is washed in 50° C. water for delipidation and washed in 25° C. water, and then washed again with sulphate, electrolysis plating is performed under the condition below to form the 15 μm thick electrolysis plated coat on the part where no plated resist is formed.

The electrolysis copper plating solution is as follows:
Sulphate: 200 g/l
Copper sulphate: 80 g/l
Additive agent: 19.5 ml/l
Atotech Japan, KAPARASYD GL)
The electrolysis plating condition:
Current density: 1 $A/dm^2$
Duration: 70 minutes
Temperature: 22±2° C.

18) After said plated resist is detached and removed with 5% KOH, the electroless plated coat under the plated resist is dissolved and removed by etching treatment with mixed solution of sulphuric acid and hydrogen peroxide to form the upper layer conductor circuit 58 and the via hole 60, as shown in FIG. 3 (f). The thickness of this upper layer conductor circuit 58 is 15 μm, preferably within 5-25 μm range.

Figure 4A:
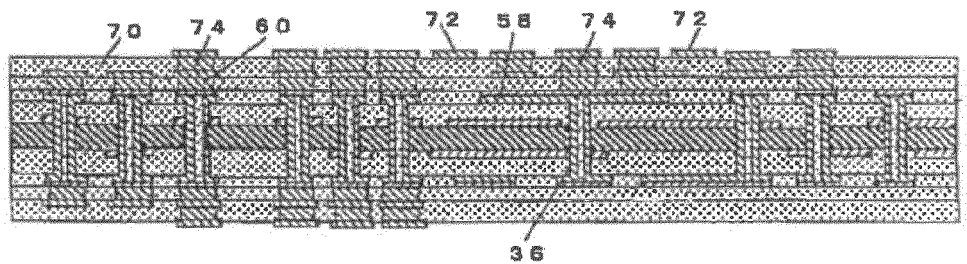
FIGS. 4 (a) to (c) are drawings showing part of the process of producing the multilayer printed wiring board according to an embodiment of the invention.
Figure 4B:
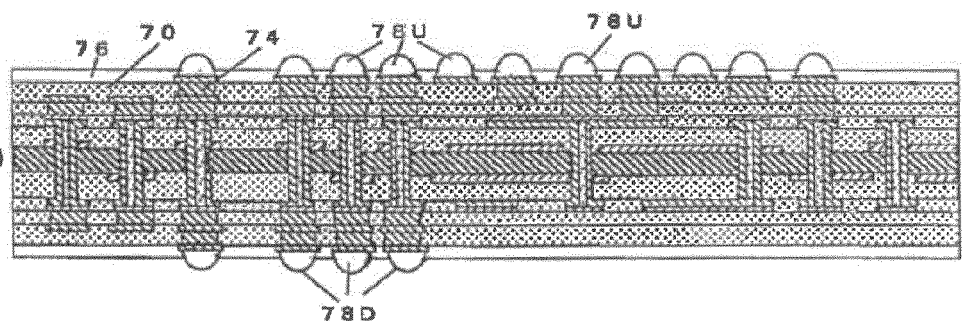
Figure 4C:
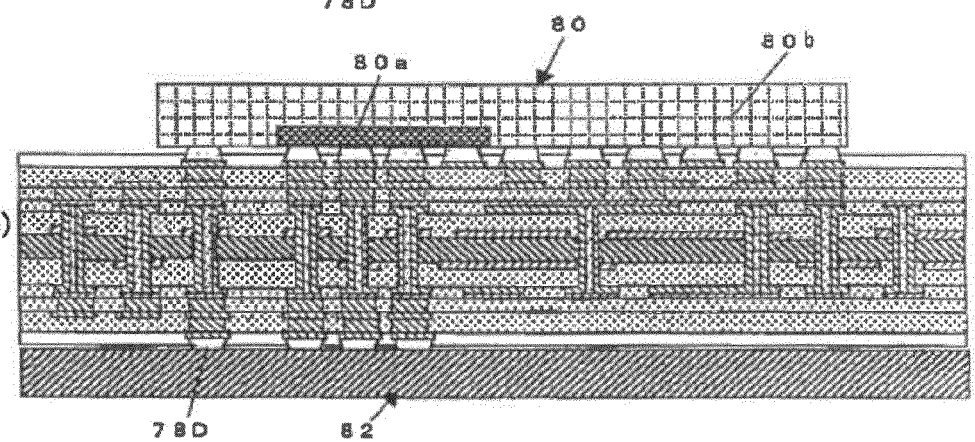

19) In addition with the same treatment as steps 11)-18) described above, the upper layer inner layer resin insulating layer 70, the upper layer conductor circuit 72 and the via hole 74 is formed as shown in FIG. 4 (a).

20) Preparing solder resist composition

Next, 45.67 parts by weight of photo sensitive attached oligomer (Molecular mass: 4000) acrylic of 50% of epoxy radial of cresol novolac-type epoxy resin (Nippon Kayaku) which is dissolved in diethylene glycol dimethyl ether (DMDG) to be 60% by weight concentration, 16.0 parts by weight of bisphenol A type epoxy resin (YUKA Shell, Product name: Epicoat 1001) dissolved in methyl ethyl ketone to be 80% by weight, 1.6 parts by weight of imidazole hardening agent (Shikoku Chemicals, Product name: 2E4MZ-CN), 4.5 parts by weight of 2-functional acrylic monomer which is photosensitive monomer (Nippon Kayaku, Product name: R604), 1.5 parts by weight of same multivalent acrylic monomer (Kyoei Kagaku Kogyo, Product name: DPE6A), and 0.71 parts by weight of polydisperse antifoam agent (SANNOPCO, S-65) are sampled in a container. This sample is stirred and mixed to prepare mixed composition, and by adding 1.8 parts by weight of benzophenone (KANTO Chemical) as a photopolymerization initiator and 0.2 parts by weight of Michler ketone (KANTO Chemical) as a photosensitizer into this mixed composition, solder resist composition obtained which is prepared as the viscosity of 2.0 Pas·s at 25° C. Note that the viscosity is measured by the B-type viscometer (Tokyo KEIKI, DVL-B type) and No. 4 rotor is used for 60 min-1 and No. 3 rotor for 6 min-1.

21) Next, on both sides of the multi-layer wiring board, the solder resist composition described above is applied for 20 μm thickness, and dried for 20 minutes at 70° C. Then, a photo mask 5 mm thick on which the solder resist opening portion pattern is drawn is contacted on the solder resist layer, and exposed to 1000 $mJ/cm^2$ ultra violet, and developed with DMTG solution to form the opening in which the diameter is 200 μm. Then, in addition, the multi-layer wiring board is heated for one hour at 80° C., for one hour at 100° C., for one hour at 120° C., and for three hours at 150° C. to harden the solder resist layer to form the solder resist pattern layer 76 15-25 µm thick having openings. As the solder resist composition described above, any commercially available solder resist composition may be used.

22) Next, the substrate on which the solder resist layer 76 is formed is dipped in electroless nickel plating solution containing nickel chloride ($2.3 \times 10^{-1}$ mol/l), sodium hypophosphite ($2.8 \times 10^{-1}$ mol/l), citric sodium ($1.6 \times 10^{-1}$ mol/l) of pH=4.5 for 20 minutes to form the nickel plated layer 5 µm thick on the opening portion. In addition, the substrate is dipped in electroless gold plating solution containing potassium gold cyanide ($7.6 \times 10^{-3}$ mol/l), ammonium chloride ($1.9 \times 10^{-1}$ mol/l), citric sodium ($1.2 \times 10^{-1}$ mol/l), and sodium hypophosphite ($1.7 \times 10^{-1}$ mol/l) for 7.5 minutes at 80° C. to form a gold plated layer 0.03 µm thick on the nickel plated layer. Other than the nickel-gold layer, a single layer of tin or precious metal layer (such as gold, silver, palladium or white gold) may be formed.

23) Then, on the opening of the solder resist layer 76 on the side where the IC chip for the board is positioned, solder paste containing tin-lead is printed and on the opening on the solder resist layer 76 on another side, solder paste containing tin-antimony is printed. Then, by reflow at 200° C., the solder bump (solder body) is formed to create the multi-layer printed wiring board having the solder bumps 78U and 78D as shown in FIG. 4 (*b*). Then, on this multilayer printed wiring board, the pad for mounting IC chip formed on the printed wiring board and the electrode of the IC chip 80 are connected via the solder bump 78U, and mounted on the daughterboard 82 via the solder bump 78D as shown in FIG. 4 (*c*).

As described above, in this embodiment, where the through-hole conductors directly below the processor core section 80*a* of the IC chip 80 are formed in narrower pitch compared to through-hole conductors in other areas, the inductance is decreased for the power supply to the processor core section 80*a*. Furthermore, where the through-hole conductors in an area 80*b* other than directly below the processor core section 80*a* are not formed in locations corresponding to pads as 1:1, the area of the power supply layer may be wider to reduce the resistance of the power supply layer.

Embodiment 2

In Embodiment 2, the process step 5) of Embodiment 1, for forming through-bores of the through-hole conductors is changed. Below the processor core section 80*a*, through hole conductors are not arranged for each and every one of the pads (possible for 50-100% number of through-holes against the number of pads, directly below the processor core section). Rather, a through-hole conductor is formed for every other pad (50%) and the pitch of the through holes is 250 µm. In areas other than directly below the processor core section 80*a*, the number of through-hole conductors against the number of pads in this area (other than directly below the processor core section 80*a*) is 10% and through-holes are formed in 300-600 µm pitch. Other than this, a multilayer printed wiring board is produced in substantially the same manner as in Embodiment 1.

Embodiment 3

In Embodiment 3, the process step 5) of Embodiment 1 for forming through-bores of the through-hole conductors is changed. The number of through hole conductors directly below the processor core section 80*a* is the same as in Embodiment 1 (i.e, 100%). Other than directly below the processor core section, the number of through-hole conductors against the number of pads in this area (other than under the processor core section 80 directly below the IC chip 80) is 50%. Directly below the area 80*b* other than the processor core section 80*a*, through-hole conductors are formed in 150-400 µm pitch, while other than directly below the IC chip 80 through-hole conductors are formed in 300-600 µm pitch. Other than this, a multilayer printed wiring board is produced in substantially the same manner as in Embodiment 1.

Embodiment 4

A multilayer printed wiring board is formed in substantially the same manner as Embodiment 1, except that 60 µm thick copper foil is used as the copper foil 16 in step 1) of Embodiment 1.

Embodiment 5

A multilayer printed wiring board is produced in substantially the same manner as Embodiment 1, except that 150-µm-thick copper foil is used as the copper foil 16 in the step 1) of Embodiment 1.

Embodiment 6

A multilayer printed wiring board is produced in substantially the same manner as Embodiment 1, except that the number of through-hole conductors per pad in an area other than directly below the processor core section 80*a* is different. In this embodiment, the number of through-hole conductors other than directly below the processor core section 80*a* is 10% of the number of pads other than directly below the processor core section 80*a*.

Embodiment 7

A multilayer printed wiring board is produced in substantially the same manner as Embodiment 2, except that the number of through-hole conductors arranged other then directly below the processor core section is changed to 30%.

Embodiment 8

A multilayer printed wiring board is produced in substantially the same manner as Embodiment 1, except that a 20 µm thick copper foil is used as the copper foil 16 in the step 1) of Embodiment 1.

Embodiment 9

A multilayer printed wiring board is produced in substantially the same manner as Embodiment 1, except that a 300 µm thick copper foil is used as the copper foil 16 in the step 1) of Embodiment 1.
REFERENCE 1

In the process step 5) of Embodiment 1, the drill and pitch is changed to form through-hole conductors. A multilayer printed wiring board is produced in the same manner as Embodiment 1 except that all of the through-hole conductors are formed in 125 µm pitch directly below all of the pads using the 100 µm diameter drill.
REFERENCE 2

The pitch to form through-hole conductors is changed from Reference 1. Through-hole conductors are not arranged directly below all of the pads (directly below the processor core section), but every other one, resulting in the through-hole conductors being formed in a 250 μm pitch. Directly below IC chips and directly below the processor core section, through-holes are arranged directly below all of the bumps in 125 μm pitch.

Evaluation Test 1

On each type of printed wiring boards produced in Embodiments 1 to 9 and References 1 and 2, either one of three kinds of IC chips (Hereinafter referred to as "IC chip No. 1 to No. 3") having drive frequency and FSB (Front side bus) as shown in Table 1 is mounted and simultaneous switching is repeated. Whether errors occurred or not is checked using for example, a pulse pattern generator/error detector (e.g., Advantest: product name "D3186/3286"). The result is shown in Table 2. O indicates no error was observed, whereas X indicates that some error was observed.

TABLE 1

| IC chip number | Drive frequency | FSB |
|---|---|---|
| No. 1 | 1.3 GHz | 400 MHz |
| No. 2 | 3.0 GHz | 800 MHz |
| No. 3 | 3.73 GHz | 1,066 MHz |

TABLE 2

| | Thickness of core conductor (μm) | | Number of TH conductor/Number of pads (%) | | TH conductor pitch (μm) | | | Mounted IC chip No. | | |
|---|---|---|---|---|---|---|---|---|---|---|
| | Surface layer | Inner layer | Area directly below processor | Area other than directly below processor | Directly below processor core | Areas other than directly below processor core | Areas other than directly below IC | 1 | 2 | 3 |
| Emb #1 | 20 | 30 | 100 | 30 | 125 | 150-400 | 300-600 | O | O | O |
| Emb #2 | 20 | 30 | 50 | 10 | 250 | 300-600 | 300-600 | O | O | X |
| Emb #3 | 20 | 30 | 100 | 50 | 125 | 150-400 | 300-600 | O | O | O |
| Emb #4 | 20 | 60 | 100 | 30 | 125 | 150-400 | 300-600 | O | O | O |
| Emb #5 | 20 | 150 | 100 | 30 | 125 | 150-400 | 300-600 | O | O | O |
| Emb #6 | 20 | 30 | 100 | 10 | 125 | 150-400 | 300-600 | O | O | O |
| Emb #7 | 20 | 30 | 50 | 30 | 250 | 300-600 | 300-600 | O | O | X |
| Emb #8 | 20 | 20 | 100 | 30 | 125 | 150-400 | 300-600 | O | O | X |
| Emb #9 | 20 | 300 | 100 | 30 | 125 | 150-400 | 300-600 | O | O | X |
| Ref #1 | 20 | 30 | 100 | 100 | 125 | 125 | — | O | X | X |
| Ref #2 | 20 | 30 | 50 | 100 | 250 | 125 | — | O | X | X |

Evaluation Test 2

On each type of printed wiring board produced in Embodiments 1 to 7, the No. 3° C. chip shown in Table 1 is mounted and simultaneous switching is repeated to measure the voltage drop in the transistor of the IC chip. Note that the test is performed after a measurable circuit is formed on the printed wiring board because the voltage in the transistor of the IC chip is difficult to measure directly.

From this result, if multiplex drive frequency becomes faster, how the voltage drop (%) (Voltage drop/Drive voltage× 100) is changed is simulated in each embodiment. The result is shown in Table 3. Generally, as the voltage drop becomes larger, failure is prone to occur. Further, if the voltage drop (%) is beyond 10% of the drive voltage, an error becomes more likely.

From the result in Table 3, where the printed wiring board in which the pitch between through-holes directly below the processor core section is narrow and the pitch between through-hole conductors in other areas is wider than the pitch between through-hole conductors directly below the processor core section (for example, Embodiments 1 and 4-6), the voltage drop is small. In addition, it is shown that when the thickness of conductors in the inner layer of the multilayer core is 60-150 μm (for example, Embodiments 4 and 5), the voltage drop can be even smaller. As noted above, where the value of voltage drop is less than 10% of the drive voltage, the occurrence of errors of the IC chip can be reduced.

TABLE 3

| Embodiment | 1 | 2 | 3 | 4 | 5 | 6 | 7 |
|---|---|---|---|---|---|---|---|
| No. 3 | 1.8 | 2.8 | 1.8 | 0.7 | 0.7 | 1.8 | 2.7 |
| 5 GHz | 2 | 3 | 2 | 1 | 1 | 2 | 3 |
| 10 GHz | 4 | 6 | 4 | 2 | 2 | 4 | 6 |
| 15 GHz | 6 | 8 | 6 | 3 | 3 | 6 | 9 |
| 20 GHz | 8 | 13 | 9 | 5 | 5 | 8 | 12 |

As described above, the present invention is effectively applied to a semiconductor device mounting substrate, suppressing errors of mounted IC chips.

What is claimed is:

1. A multilayer printed wiring board comprising:
a core substrate;
a built-up wiring layer having a first surface in contact with the core substrate and a second surface on an opposite side of the first surface, the second surface of the built-up wiring layer including a mounting area on which at least one semiconductor device is to be mounted, the built-up wiring layer comprising a plurality of conductor circuits and a plurality of insulating resin layers;
a plurality of first through-hole conductors formed in a first portion of the core substrate which corresponds to the mounting area of the second surface;
a plurality of second through-hole conductors formed in a second portion of the core substrate which corresponds to an area of the second surface other than the mounting area;
a plurality of third through-hole conductors formed in a processor core area of the first portion of the core substrate which corresponds to a processor core section of the at least one semiconductor device; and
a plurality of pads provided on the second surface,
wherein the first through-hole conductors have a pitch which is smaller than a pitch of the second through-hole conductors, and the third through-hole conductors have a pitch which is smaller than the pitch of the first through-hole conductors.

2. The multilayer printed wiring board of claim 1, wherein the pitch of the third through-hole conductors is 125-250 μm.

3. The multilayer printed wiring board of claim 1, wherein the pitch of the first through-hole conductors is 150-600 μm.

4. The multilayer printed wiring board of claim 1, wherein the pitch of the second through-hole conductors is 200-600 μm.

5. The multilayer printed wiring board of claim 1, wherein the pitch of the third through-hole conductors is matched to the pitch of the pads arranged directly below the processor core section of the semiconductor device.

6. The multilayer printed wiring board of claim 1, wherein the core substrate comprises a multilayer core substrate made by alternately layering conductor circuits and insulating resin layers on a core material, and when T represents a thickness of a conductor circuit formed inside the multilayer core substrate and t represents a thickness of a conductor circuit formed on an outer surface of the multilayer core substrate, T is greater than or equal to 1.5 t.

7. The multilayer printed wiring board of claim 1, wherein one of the first through-hole conductors is electrically connected to a base conductor layer of the multilayer printed wiring board and is positioned adjacent to one of the first through-hole conductors which is electrically connected to a power supply conductor layer of the multilayer printed wiring board.

8. The multilayer printed wiring board of claim 7, wherein one of the second through-hole conductors is electrically connected to a base conductor layer of the multilayer printed wiring board and is positioned adjacent to one of the second through-hole conductors which is electrically connected to a power supply conductor layer of the multilayer printed wiring board, such that a mutual inductance between adjacent through hole conductors in the first through hole conductors is less than a mutual inductance between adjacent through hole conductors in the second through hole conductors.

9. The multilayer printed wiring board of claim 1, wherein at least one of the plurality of first through-hole conductors and the plurality of second through-hole conductors does not include a dummy land.

10. A method of forming a multilayer printed wiring board comprising:
providing a core substrate;
providing a built-up wiring layer on the core substrate, the built-up wiring layer having a first surface in contact with the core substrate and a second surface on an opposite side of the first surface, the second surface including a mounting area on which at least one semiconductor device is to be mounted, the built-up wiring layer comprising a plurality of conductor circuits and a plurality of insulating resin layers;
providing a plurality of first through-hole conductors in a first portion of the core substrate which corresponds to the mounting area of the second surface;
providing a plurality of second through-hole conductors in a second portion of the core substrate which corresponds to an area of the second surface other than the mounting area;
forming a plurality of third through-hole conductors in a processor core area of the first portion of the core substrate which corresponds to a processor core section of the at least one semiconductor device; and
forming a plurality of pads on the second surface,
wherein the first through-hole conductors have a pitch which is smaller than a pitch of the second through-hole conductors, and the third through-hole conductors have a pitch which is smaller than the pitch of the first through-hole conductors.

11. The method of claim 10, wherein the pitch of the third through-hole conductors is 125-250 μm, the pitch of the first through-hole conductors is 150-600 μm, and the pitch of the second through-hole conductors is 200-600 μm.

12. The method of claim 10, wherein the providing of the core substrate comprises providing a multilayer core substrate made by alternately layering conductor circuits and insulating resin layers on a core material, wherein when T represents a thickness of a conductor circuit formed inside the multilayer core substrate and t represents a thickness of a conductor circuit formed on an outer surface of the multilayer core substrate, T is greater than or equal to 1.5 t.

13. The method of claim 10, wherein at least one of the plurality of first through-hole conductors and the plurality of second through-hole conductors comprises a through-hole conductor that does not include a dummy land.

* * * * *